US009520441B2

(12) United States Patent
Swain et al.

(10) Patent No.: US 9,520,441 B2
(45) Date of Patent: Dec. 13, 2016

(54) METHOD FOR ELECTRONICALLY PINNING A BACK SURFACE OF A BACK-ILLUMINATED IMAGER FABRICATED ON A UTSOI WAFER

(75) Inventors: Pradyumna Kumar Swain, Gaithersburg, MD (US); David Jay Cheskis, Princeton, NJ (US); Mahalingam Bhaskaran, Princeton, NJ (US)

(73) Assignee: SRI INTERNATIONAL, Menlo Park, CA (US)

( * ) Notice: Subject to any disclaimer, the term of this patent is extended or adjusted under 35 U.S.C. 154(b) by 901 days.

(21) Appl. No.: 12/466,795

(22) Filed: May 15, 2009

(65) Prior Publication Data

US 2009/0294883 A1 Dec. 3, 2009

Related U.S. Application Data

(60) Provisional application No. 61/057,320, filed on May 30, 2008.

(51) Int. Cl.
*H01L 27/14* (2006.01)
*H01L 27/146* (2006.01)
*H01L 21/84* (2006.01)

(52) U.S. Cl.
CPC ..... *H01L 27/14687* (2013.01); *H01L 27/1464* (2013.01); *H01L 21/84* (2013.01)

(58) Field of Classification Search
CPC . H01L 21/84; H01L 27/1464; H01L 27/14687
USPC .......................... 257/431–432, 447, 461–464
See application file for complete search history.

(56) References Cited

U.S. PATENT DOCUMENTS

| | | | | | |
|---|---|---|---|---|---|
| 4,492,743 | A | * | 1/1985 | Howe | 429/111 |
| 4,521,800 | A | * | 6/1985 | Howe | 257/755 |
| 4,982,096 | A | * | 1/1991 | Fujii et al. | 250/367 |
| 4,999,694 | A | * | 3/1991 | Austin et al. | 257/188 |
| 5,229,626 | A | * | 7/1993 | Ebitani et al. | 257/84 |
| 5,557,167 | A | * | 9/1996 | Kim et al. | 313/542 |
| 6,667,528 | B2 | * | 12/2003 | Cohen et al. | 257/469 |
| 6,720,589 | B1 | * | 4/2004 | Shields | 257/194 |
| 7,129,489 | B2 | * | 10/2006 | Pham | 250/338.4 |

(Continued)

OTHER PUBLICATIONS

"Energy band diagram of a planar metal-insulator-semiconductor junction"—Dan Thomas Jul. 11, 1997.*

*Primary Examiner* — Mohammed Shamsuzzaman
(74) *Attorney, Agent, or Firm* — Marger Johnson

(57) ABSTRACT

A method for fabricating a back-illuminated imager which has a pinned back surface is disclosed. A first insulator layer is formed overlying a mechanical substrate. A conductive layer is deposited overlying the first insulator layer. A second insulator layer is formed overlying the conductive layer to form a first structure, an interface being formed between the conductive layer and the second insulator layer, the conductive layer causing band bending proximal to the interface such that the interface is electrically pinned. Hydrogen is implanted in a separate device wafer to form a bubble layer. A final insulator layer is formed overlying the device wafer to form a second structure. The first structure and the second structure are bonded to form a combined wafer. A portion of the combined wafer is removed underlying the bubble layer to expose a seed layer comprising the semiconductor material substantially overlying the second insulator layer.

10 Claims, 5 Drawing Sheets

(56) References Cited

U.S. PATENT DOCUMENTS

| | | | |
|---|---|---|---|
| 7,238,583 B2* | 7/2007 | Swain et al. | 438/358 |
| 7,425,460 B2* | 9/2008 | Pain | 438/29 |
| 7,608,830 B1* | 10/2009 | Kinch | 250/370.06 |
| 7,855,128 B2* | 12/2010 | Zhu et al. | 438/458 |
| 2005/0205930 A1* | 9/2005 | Williams, Jr. | 257/347 |
| 2006/0076590 A1* | 4/2006 | Pain et al. | 257/294 |
| 2006/0118722 A1* | 6/2006 | Pham | 250/338.4 |
| 2006/0186560 A1* | 8/2006 | Swain et al. | 257/E27.133 |
| 2007/0284564 A1* | 12/2007 | Biwa et al. | 257/13 |
| 2010/0213560 A1* | 8/2010 | Wang et al. | 257/432 |

\* cited by examiner

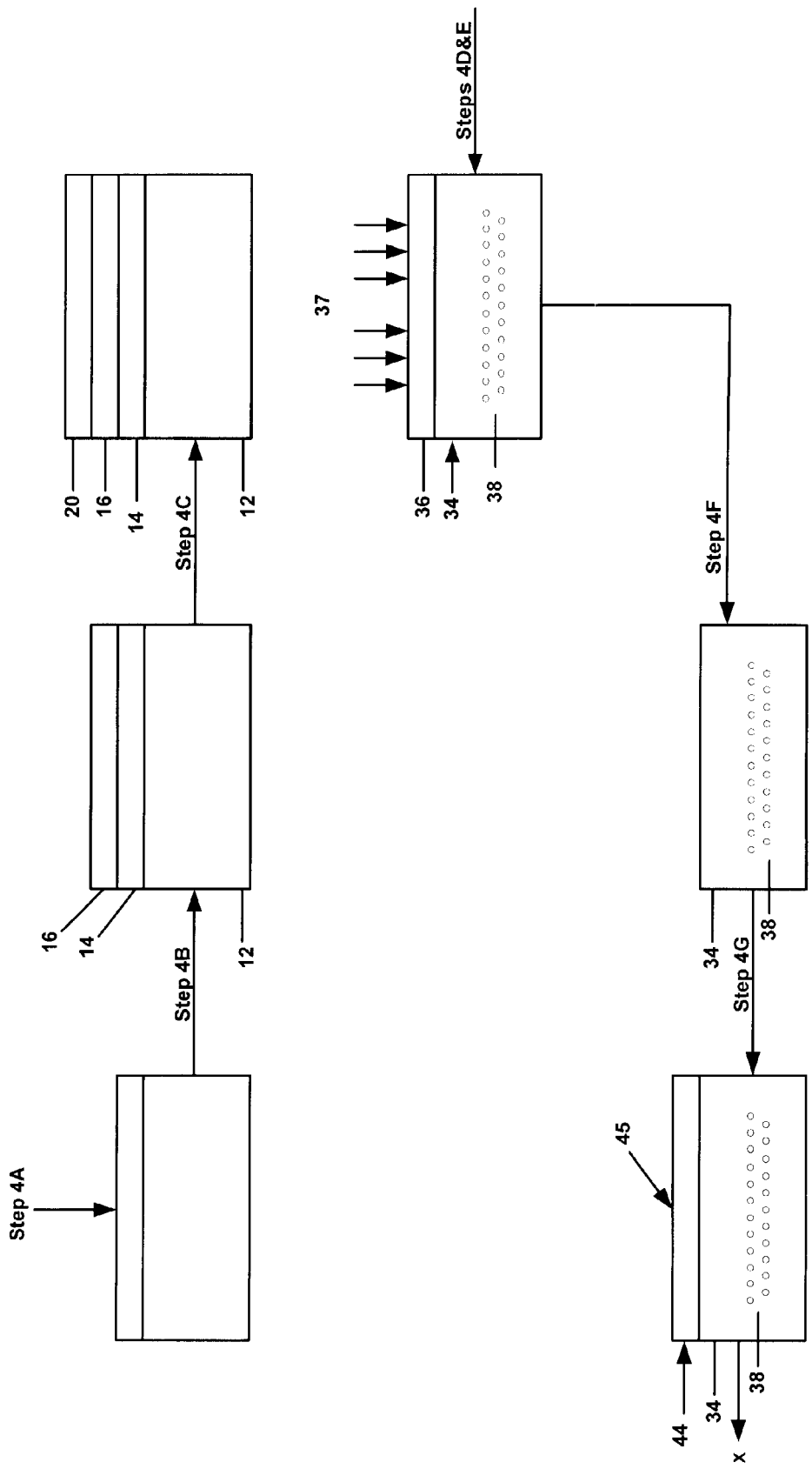

METHOD FOR ELECTRONICALLY PINNING A BACK SURFACE OF A BACK-ILLUMINATED IMAGER FABRICATED ON A UTSOI WAFER

CROSS-REFERENCE TO RELATED APPLICATIONS

This application claims the benefit of U.S. provisional patent application No. 61/057,320 filed May 30, 2008, the disclosure of which is incorporated herein by reference in its entirety.

FIELD OF THE INVENTION

The field of invention is semiconductor device fabrication and device structure. More specifically, the field is fabrication and structure of back-illuminated semiconductor imaging devices that employ ultra-thin silicon on insulator (UT-SOI) substrates, wherein the back surface of the imaging devices are electrically pinned.

BACKGROUND OF THE INVENTION

Thinned, back illuminated, semiconductor imaging devices are advantageous over front-illuminated imagers for high fill factor and better overall efficiency of charge carrier generation and collection. A desired property of such devices is that the charge carriers generated by light or other emanation incident on the back side should be driven to the front side quickly to avoid any horizontal drift, which may smear the image. It is also desirable to minimize the recombination of the generated carriers before they reach the front side, since such recombination reduces overall efficiency and sensitivity of the device.

This desired property may be achieved by providing a thin semiconductor layer and a high electric field within this layer. The field should extend to the back surface, so that the generated carriers, such as electrons or holes, can be driven quickly to the front side. This requires additional treatment at the backside of the device, which adds to complexity of the fabrication process. One current technique includes chemical thinning of semiconductor wafers and deposition of a "flash gate" at the backside after thinning. This requires critical thickness control of the backside flash gate. Another technique involves growth of a thin dopant layer on a wafer back using molecular beam epitaxy (MBE). Still another known method used to provide a desired electric field is to create a gradient of doping inside the thinned semiconductor layer by backside implant of the layer followed by appropriate heat treatment for annealing and activation.

These methods can not be easily included in conventional semiconductor foundry processing, and require more expensive custom processing. They are therefore often not cost-effective and not suitable for commercial manufacturing.

Electron-hole pairs generated near the back surface of a back-illuminated imager need to be driven away from the back surface due to another feature of the manufacturing process. One process step employed during the fabrication of back illuminated imagers is back thinning of the silicon substrate. This may involve partial or total removal of the substrate to expose a thinned back surface. The thinning process introduces electrical trap sites on the back surface of the imager. Due to inherent dangling bonds present at or near the back surface of the imager, optically generated electrons inside the substrate will tend to recombine at the back surface. Therefore, Quantum Efficiency (QE) may be degraded if generated electrons are allowed to reach the back surface. To prevent the charge carriers from moving towards the back surface, the back surface needs to be treated in such a way that the back surface is electrically pinned, i.e., the back surface should be saturated with a high enough concentration of electrons such that generated electrons moving toward the back surface are repelled toward the front surface of the imager.

An electrically pinned back surface may provide an appropriate electric field because of band bending, and thus prevent the recombination of photo generated charge carriers at the back surface. Backside pinning is typically achieved by ion implantation of an appropriate impurity type and high temperature ion activation by furnace annealing. High temperature furnace annealing results in a uniform and stable doping profile near the back surface. FIG. 1 shows a typical backside boron profile of a thinned p-type substrate which is electrically pinned. The boron concentration gradient at the back surface as shown in FIG. 1 provides the necessary electric field to block optically generated electrons from moving towards the back surface. However, the high temperature ion activation furnace annealing imposes several restrictions on the process sequence, such as metal deposition. Other techniques such as laser annealing and flash oxide deposition are currently being pursued. These techniques, however, are considered to be undesirable for producing low cost, highly manufacturable back-illuminated imagers. In addition, the thinning process poses yield issues such as stress in the thinned wafer, and non-uniformity of thickness. Fabrication costs for current fabricating techniques for producing thinned back-illuminated imagers with back side pinning is high compared to non-pinned fabrication methods.

A technique for producing highly manufacturable, low cost back illuminated imagers that exhibits an internal electric field that drives electrons toward the front side of the imager is disclosed in U.S. Pat. No. 7,238,583 by Swain et. al. (the "'583 patent"), which is incorporated herein by reference in its entirety. In addition to the desired internal electric field, the device of the '583 patent also employs ultra thin Silicon-on-Insulator (UTSOI) technology for providing a semiconductor substrate on which the back-illuminated imager is constructed.

To manufacture the UTSOI imager of the '583 patent, the starting structure is an initial substrate, sometimes referred to in the art as a UTSOI substrate. The starting UTSOI substrate is composed of a mechanical substrate (handle wafer) configured to provide mechanical support during processing, an insulator layer 14 (which can be, for example, a buried oxide layer of silicon (BOX)), and a semiconductor substrate (also referred to as the "seed layer"). The seed layer is doped with a high concentration of p or n-type dopant, typically boron. An epitaxial layer is grown overlying the doped seed layer. The epitaxial layer provides a layer for fabricating front side components which complete the overall imaging device. During the growth of epitaxial layer, dopants previously introduced into the seed layer diffuse into the epitaxial layer. At the conclusion of the growth of the epitaxial layer, a net final doping profile is created. Once the epitaxial layer is grown, one or more imaging components may be fabricated in the epitaxial layer using known methods of semiconductor fabrication.

Processing parameters such as doping levels, initial doping profiles, and temperatures are chosen to give the desired doping profile, as shown in FIG. 2, reproduced from the '583 patent show the results of computer simulations of a desired net doping profile. In FIG. 2, Region 130 corresponds to the insulator layer; Region 120 corresponds to the seed layer; Region 100 corresponds to the epitaxial layer; reference number 125 corresponds to the interface between the seed layer and the insulator layer; and reference number 110 corresponds to an interface between the seed layer and the epitaxial layer.

FIG. 2 shows a net final doping profile 140 after growth of the epitaxial layer 100. The net final doping profile 140 in this simulated process exhibits the following desirable features: it has a maximum value at the interface 125 between the seed layer 120 and the insulator layer 130 and decreases monotonically with increasing distance from the interface 125 within the seed layer 120 and the epitaxial layer 100. The UTSOI back-illuminated imager of the '583 patent thus has a back side at the interface 125 between the seed layer 120 and the insulator layer 130 that is electrically pinned by means of the introduction of a monotonically decreasing net doping concentration within the seed layer 120 and the epitaxial layer 100.

Accordingly, what would be desirable, but has not yet been provided, is a method and resulting device for producing thinned CCD/CMOS back illuminated imagers based on UTSOI technology which has a pinned back surface and an internal electric field which drives electrons toward the front surface, but does not require the introduction of impurities to produce a monotonically decreasing net doping profile.

SUMMARY OF THE INVENTION

The above-described problems are addressed and a technical solution achieved in the art by providing a method for fabricating a back illuminated imager which has a pinned back surface. The method includes the steps of: forming a first insulator layer overlying a mechanical substrate; depositing a conductive layer overlying the first insulator layer; forming a second insulator layer overlying the conductive layer to form a first structure, wherein an interface is formed between the conductive layer and the second insulator layer, and wherein the conductive layer causes band bending proximal to the interface such that the interface is electrically pinned; bonding a device wafer comprising a semiconductor material to the second insulating layer; and removing a portion of the semiconductor material to expose a seed layer substantially overlying the second insulator layer. According to an embodiment of the present invention, the steps of bonding and removing further comprise the steps of: providing a device wafer comprising a semiconductor material, implanting hydrogen in the device wafer to form a bubble layer; forming a final insulator layer overlying the device wafer to form a second structure; bonding the first structure and the second structure to form a combined wafer; and removing a portion of the combined wafer underlying the bubble layer to expose a seed layer comprising the semiconductor material substantially overlying the second insulator layer.

The step of removing a portion of the combined wafer may include the step of splitting the combined wafer along a plane of the bubble layer. The first structure and the second structure are bonded between the second insulator layer of the first structure and the final insulator layer of the second structure.

The method may further comprise the steps of, before said step of forming a final insulator layer: forming a third insulator layer overlying the device wafer, wherein the hydrogen is implanted into the device wafer through the third insulator layer to produce the bubble layer; and etching away the third insulator layer.

To complete a back-illuminated imager device, the method may further comprise the steps of growing an epitaxial layer overlying the seed layer; and fabricating at least one imaging component in the epitaxial layer.

Optionally, the method may further comprise the step of forming a metal contact on a surface of the epitaxial layer which extends though to the conductive layer to provide biasing to drive electrons away from the interface toward the seed layer.

The method may further comprise the step of removing a portion of the first insulator layer following complete removal of the mechanical substrate such that a remaining portion of the first insulator layer functions as an anti-reflection coating for electromagnetic radiation.

According to an embodiment of the present invention, the method for fabricating a back illuminated imager which has a pinned back surface may comprise the steps of: providing a first structure comprising: a first insulator layer; a conductive layer substantially overlying the first insulator layer; and a second insulator overlying the conductive layer, wherein an interface is formed between the conductive layer and the second insulator layer, and wherein the conductive layer causes band bending proximal to the interface such that the interface is electrically pinned; providing a second structure comprising: a device wafer comprising a semiconductor material; and a final insulator layer overlying the device wafer; implanting hydrogen in the device wafer to form a bubble layer; bonding the first structure and the second structure to form a combined wafer; and removing a portion of the combined wafer underlying the bubble layer to expose a seed layer comprising the semiconductor material substantially overlying the second insulator layer.

The resulting device may comprise: a first insulator layer, a conductive layer substantially overlying the first insulator layer; a second insulator overlying the conductive layer, wherein an interface is formed between the conductive layer and the second insulator layer, and wherein the conductive layer causes band bending proximal to the interface such that the interface is electrically pinned; and a seed layer overlying the second insulator layer. The conductive layer may be made of metal. The metal may be indium-tin oxide. Alternatively, the conductive layer may be made of doped polysilicon. The conductive layer may have a thickness in the range of about 25 Angstroms to 30 Angstroms so that it is optically transparent. The second insulator layer may have a thickness of about 15 Angstroms. The first insulator layer may have a predetermined thickness of about 1000 Angstroms.

To complete a back-illuminated imager, the device may further comprise an epitaxial layer grown overlying the seed layer; and at least one imaging component fabricated in the epitaxial layer. The at least one imaging component may be at least one of a CMOS imaging component, a charge-coupled device component, a photodiode, an avalanche photodiode, and a phototransistor. The device may further comprise a metal contact formed on a surface of the epitaxial layer which extends though to the conductive layer to provide biasing to drive electrons away from the interface toward the seed layer. The mechanical substrate, the epitaxial layer and seed layer may comprise silicon and the first and second insulator layers may comprise an oxide of silicon.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 1:
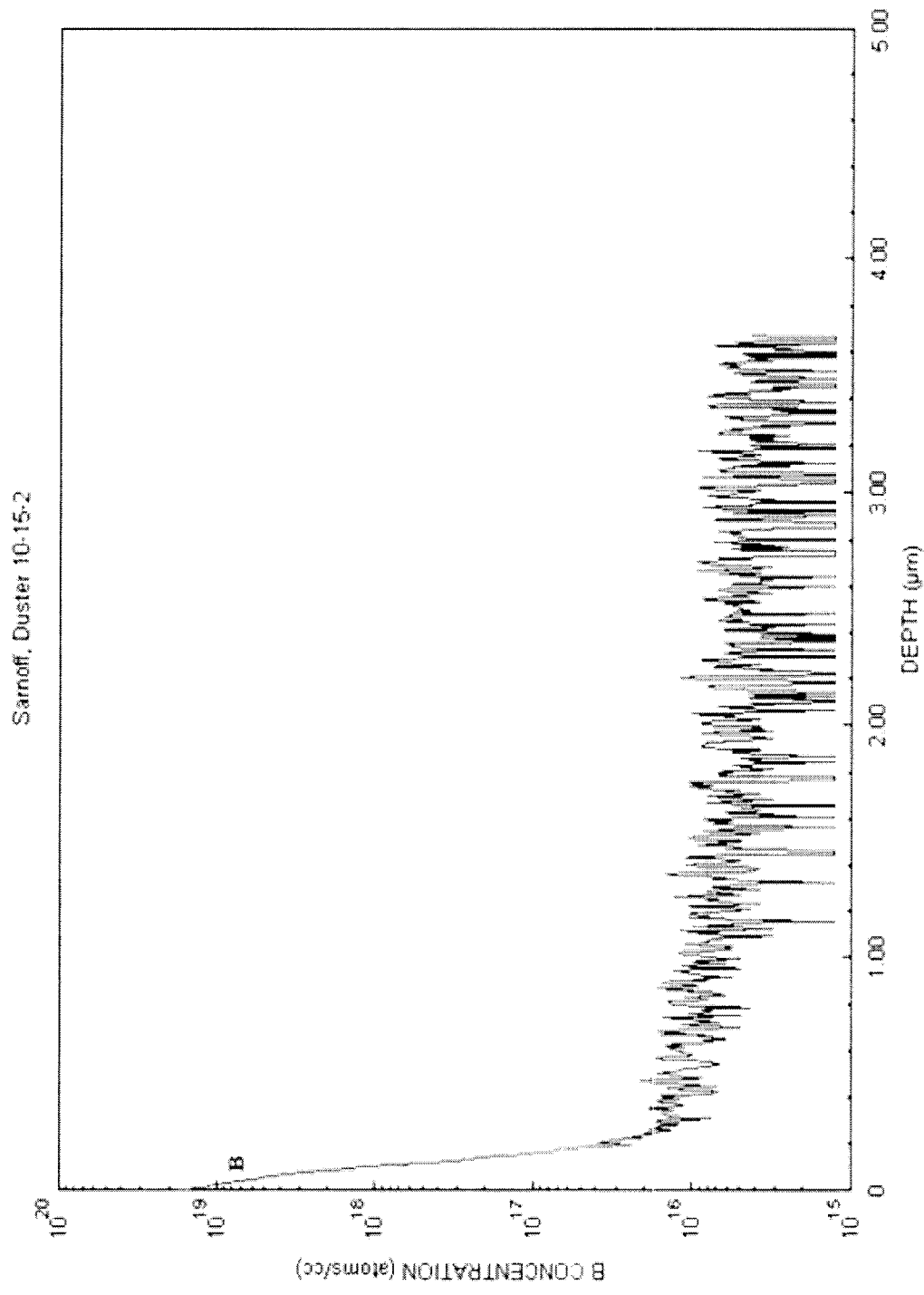
FIG. 1 shows a typical backside boron profile of a thinned p-type substrate which is electrically pinned.
Figure 2:
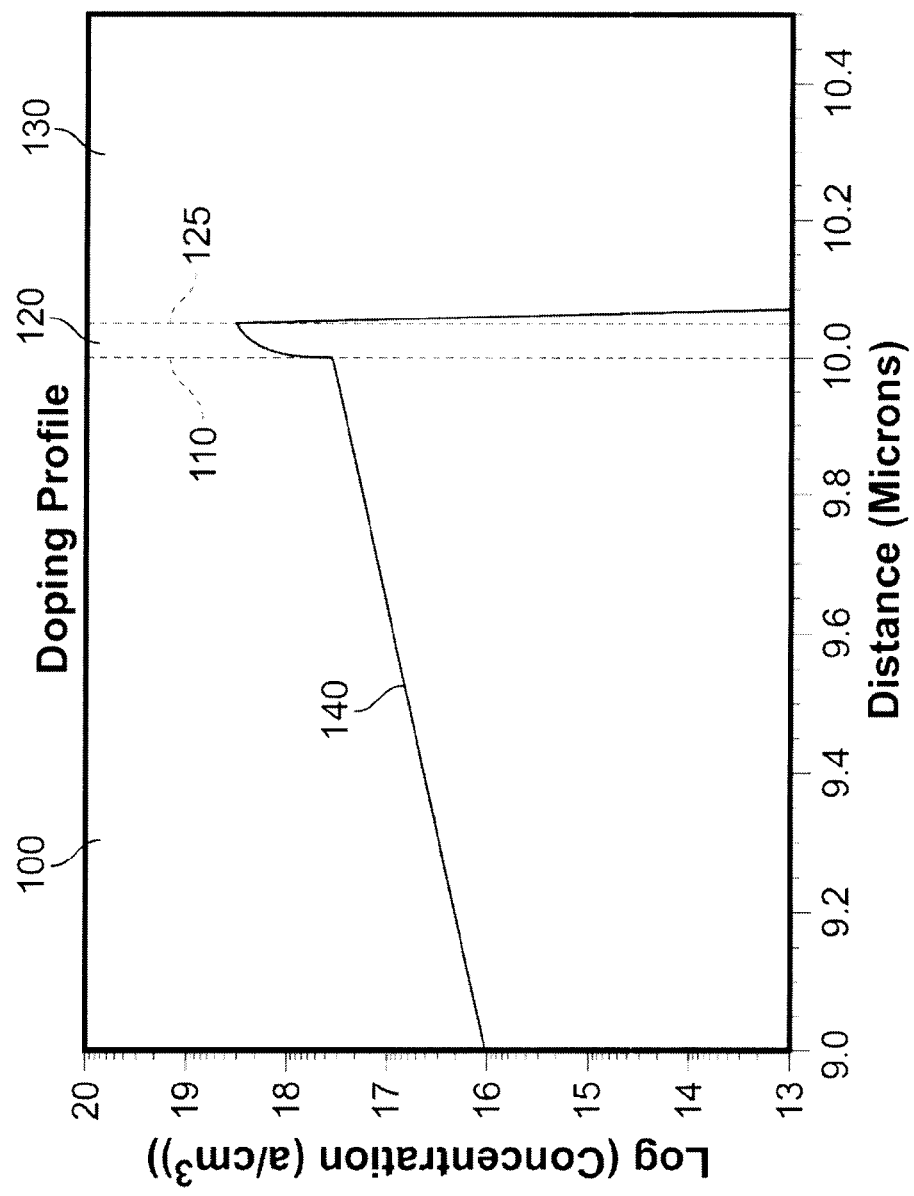
FIG. 2 shows a doping profile following growth of an epitaxial layer as described in the '583 patent.
Figure 3:
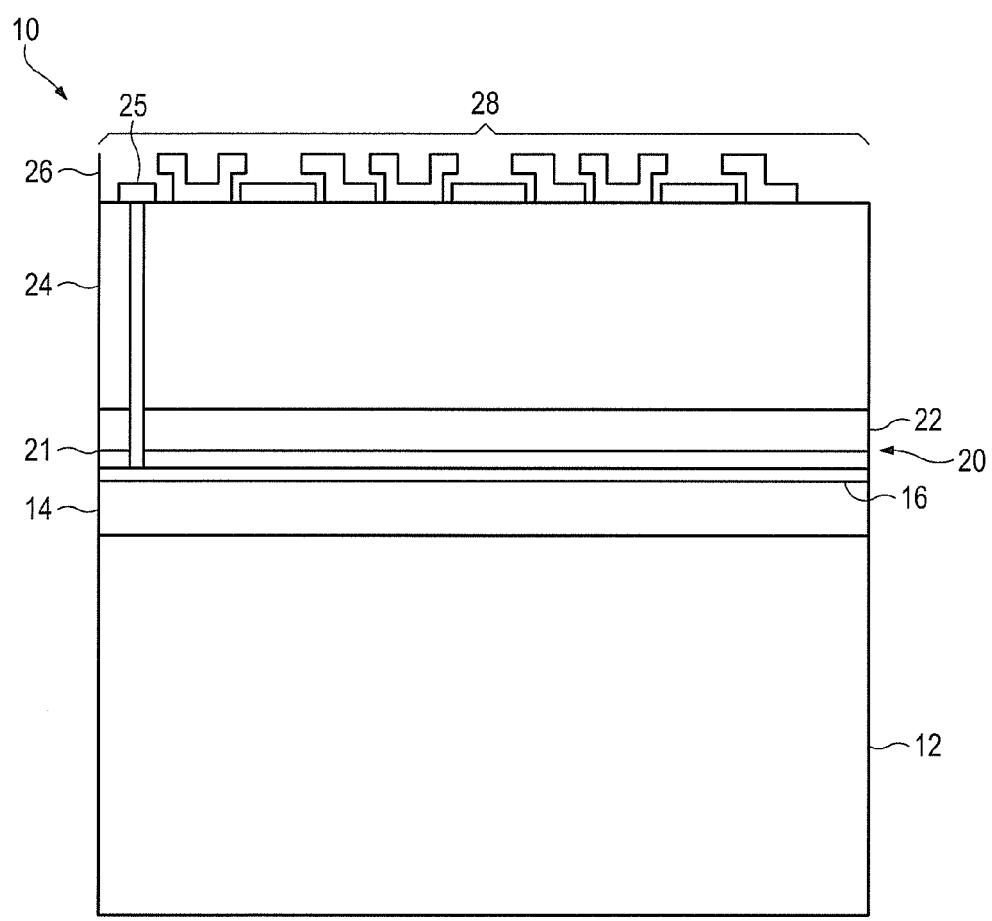
FIG. 3 shows an exemplary pinned back-illuminated UTSOI imager, according to an embodiment of the present invention.

FIG. 3 shows an exemplary pinned back-illuminated UTSOI imager 10, constructed in accordance with an illustrative embodiment of the present invention. The UTSOI imager 10 initially includes a mechanical substrate 12, composed of any suitable material, such as, for example, silicon. A first insulator layer 14 (e.g., an oxide of silicon layer) overlies the mechanical substrate 12. A thin conductive layer 16, preferably made of metal, overlies the first insulator layer 14. According to an embodiment of the present invention, the conductive (metal) layer 16 has a thickness in the range of between 25-30 Angstroms. In this thickness range, the conductive layer 16 may be optically transparent. In other embodiments, the conductive layer 16 may be made of doped polysilicon.

A second insulator layer 20, preferably made of an oxide of silicon, overlies the conductive layer 16. A seed layer 22, preferably made of silicon, is formed overlying the second insulator layer 20 by a process known in the art as "Smart Cut," to be described hereinbelow. An epitaxial layer 24 is provided and overlies the seed layer 22. A metal contact 25 may be formed on the top surface 26 of the UTSOI imager 10 (i.e., a front surface of the epitaxial layer 24) during the manufacturing of the imaging components 28 which extend through to the conductive layer 16 to provide additional biasing. This metal contact is used to enhance pinning of the interface 21 by allowing the conductive layer 16 to be further biased to drive electrons away from the interface 21 and toward the top surface 26 of the UTSOI imager 10. The conductive layer 16 provides the necessary band bending of the silicon atoms at an interface 21 between the conductive layer 16 and the second insulator layer 20 such that the interface 21 is electrically pinned. The conductive layer 16 creates an internal electrical field in the UTSOI imager 10 that repels electrons near the interface 21 and drives the electrons toward a top surface 26 of the UTSOI imager 10, thus preventing the recombination of photo generated charge carriers near the interface 21.

The one or more imaging components 28 may be fabricated on the front surface 26 in the epitaxial layer 24 using any known methods of semiconductor fabrication. These imaging components may include, but are not limited to, a charge-coupled device (CCD) component, a CMOS imaging component, a photodiode, an avalanche photodiode, a phototransistor, or other optoelectronic device, in any combination. The imaging components 28 may include both CCD and CMOS components fabricated in separate areas of the epitaxial layer 24 using known masking methods. Also included may be other electronic components such as CMOS transistors (not shown), bipolar transistors (not shown), capacitors (not shown), or resistors (not shown). One or more p-n junctions of various depths may be formed during the fabrication of the imaging components 28.

According to an embodiment of the present invention, once the fabrication of the imaging components 28 is complete, the mechanical substrate 12 is no longer needed to provide mechanical stability and the mechanical substrate 12 may be removed. Removal of the mechanical substrate 12 may also be desirable in order to allow the emanation being detected to illuminate the back side of the resulting UTSOI imager 10. Removal of the mechanical substrate 12 may be accomplished by any suitable method, such as, for example, chemical etching, mechanical grinding, or a combination of these methods. With chemical etching, the mechanical substrate 12 may be removed selectively, without removing the first insulator layer 14.

If the mechanical substrate 12 is entirely removed, the first insulator layer 14 may be removed, either partially or entirely. In one embodiment, the first insulator layer 14 is made to act as an anti-reflection coating for electromagnetic waves having wavelengths in a predetermined range, thereby allowing more photons to reach, and be absorbed in the seed layer 22 and the epitaxial layer 24. This may be accomplished by reducing thickness of the first insulator layer 14 to a thickness which minimizes reflection in the predetermined wavelength range. The thickness may be determined by the wavelength range and the index of refraction of the material of the first insulator layer 14 in this wavelength range.

After partially removing the first insulator layer 14, one or more anti-reflective coating layers (e.g., zirconium oxide or bismuth oxide) (not shown) may be deposited on the first insulation layer 14 to function as an overall anti-reflective coating stack for a desired range of wavelengths. In certain embodiments of the present invention, the first insulation layer 14 may be completely etched away, and one or more anti-reflective coating layers may be deposited on the conductive layer 16 so as to function as an overall antireflective coating.

Figure 4:
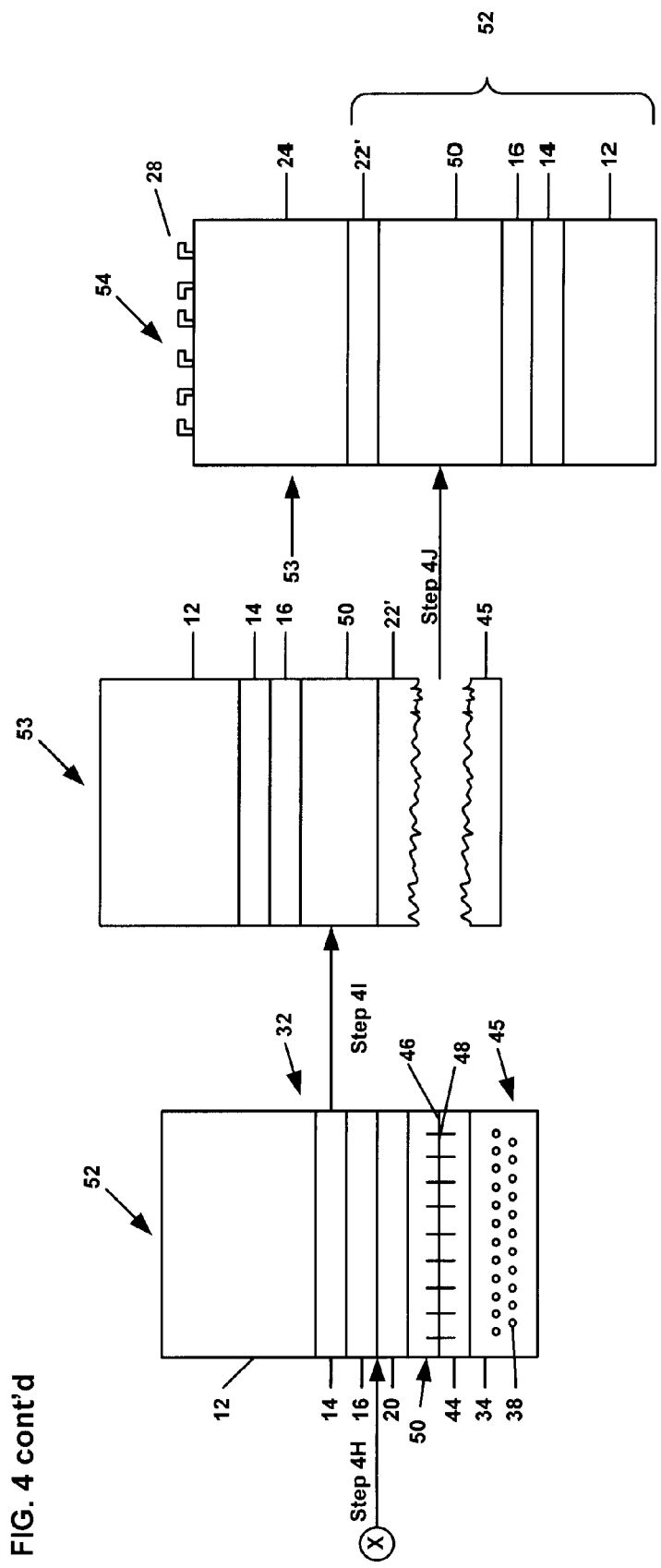
FIG. 4 illustrates exemplary steps of manufacturing a pinned back-illuminated UTSOI imager, according to an embodiment of the present invention.

Referring now to FIG. 4, steps for manufacturing a back-illuminated imager based on UTSOI technology which has a pinned back surface according to an embodiment of the present invention is depicted. In Step 4A, the mechanical substrate 12 is cleaned and the first insulator layer 14 (e.g., an oxide of silicon layer preferably of a predetermined thickness of about 1000 Angstroms) is grown substantially overlying the mechanical substrate 12. In Step 4B, the conductive layer 16 (preferably made of a metal such as indium-tin oxide or doped polysilicon) is deposited overlying the first insulator layer 14. As discussed above, according to an embodiment of the present invention, the conductive layer 16 may have a thickness on the order of 25 A-30 A, such that the conductive layer 16 is optically transparent. In Step 4C, the second insulator layer 20 (preferably having a thickness of about 15 A) is deposited overlying the conductive layer 16 to form a first structure 32.

In Step 4D, a device wafer 34 is provided and a third insulator layer 36 (e.g., an oxide layer of silicon) is grown substantially overlying the device wafer 34. In Step 4E, hydrogen 37 is implanted into the device wafer 34 from a side 38 of the device wafer 34 containing the third insulator layer 36. The hydrogen implant creates a bubble layer 38 at a mean (predetermined) depth. The bubble layer 38 may be at a depth of about 1000 to 2000 A but not limited to that range.

In Step 4F, the third insulator layer 36, damaged by the implanted hydrogen, is etched away completely. In step 4G, a final insulator layer 44 of about 15 A thickness is grown overlying the device wafer 34 (i.e., replacing the previously removed third insulator layer 36 to form a second structure 45).

After the implantation of hydrogen is completed, in Step 4H, the first structure 32 and the second structure 44 are bonded together at a surface 46 of the first structure 32 (i.e., an exposed surface of the second insulator layer 20), and a surface 48 of the second structure 45 (which is a surface of the final insulator layer 44), resulting in a combined insulator layer 50 (e.g., an oxide of silicon layer 50) of a combined wafer 52.

In Step 4I, the combined wafer 52 is split along the plane of the weakened bubble layer 38 using the "Smart Cut" technique, and a major portion of the second structure 45 is removed while leaving the resulting seed layer 22' bonded to the combined insulator layer 50 to form an ultra thin silicon-on-insulator (UTSOI) wafer 53. In Step 4J, the epitaxial layer 24 is grown substantially overlying the seed layer 22' of the UTSOI wafer 53, using the seed layer 22' as the template. The epitaxial layer 24 provides a layer for fabricating the imaging components 28 to form the overall imaging device 54, as shown in FIG. 3. As discussed above, optionally, a metal contact may be formed on a surface of the epitaxial layer 24 which extends though to the conductive layer 16 to provide biasing to drive electrons away from the interface 18 toward the seed layer 22'.

In FIG. 4, the steps of removing the mechanical substrate 12 and creating optional anti-reflection layers/coatings are omitted from the diagrams but may be optionally employed.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A semiconductor device, comprising:
   a first insulator layer formed of a material, overlying a substrate, the first insulator layer having a thickness which minimizes reflection in a predetermined wavelength range based upon the wavelength range and an index of refraction of the material;
   a conductive layer substantially overlying the first insulator layer, wherein the conductive layer is optically transparent;
   a second insulator overlying the conductive layer, wherein an interface is formed between the conductive layer and the second insulator layer, and wherein the conductive layer causes band bending proximal to the interface such that the interface is electrically pinned; and
   a seed layer overlying the second insulator layer;
   an epitaxial layer grown substantially overlying the seed layer;
   a metal contact on the epitaxial layer extending to the conductive layer; and
   one or more anti-reflective coating layers deposited on the first insulator layer to function as an antireflective coating stack, wherein the semiconductor device is configured such that electromagnetic radiation received through the one or more anti-reflective coating layers is absorbed in at least one of the seed layer and the epitaxial layer.

2. The device of claim 1, wherein the conductive layer comprises metal.

3. The device of claim 2, wherein the metal is indium-tin oxide.

4. The device of claim 1, wherein the conductive layer comprises doped polysilicon.

5. The device of claim 1, wherein the conductive layer has a thickness in the range of about 25 Angstroms to 30 Angstroms.

6. The device of claim 1, wherein the second insulator layer has a thickness of about 15 Angstroms.

7. The device of claim 1, wherein the first insulator layer has a thickness of about 1000 Angstroms.

8. The device of claim 1, further comprising: at least one imaging component fabricated on the epitaxial layer.

9. The device of claim 8, wherein the at least one imaging component is at least one of a CMOS imaging component, a charge-coupled device component, a photodiode, an avalanche photodiode, and a phototransistor.

10. The device of claim 8, wherein the epitaxial layer and seed layer comprise silicon and the first and second insulator layers comprise an oxide of silicon.

* * * * *

UNITED STATES PATENT AND TRADEMARK OFFICE
CERTIFICATE OF CORRECTION

Page 1 of 1

PATENT NO. : 9,520,441 B2
APPLICATION NO. : 12/466795
DATED : December 13, 2016
INVENTOR(S) : Pradyumna Kumar Swain et al.

It is certified that error appears in the above-identified patent and that said Letters Patent is hereby corrected as shown below:

In the Specification

Column 4, Line 7 reads:
"though"
Should read:
"through"

Column 4, Line 57 reads:
"though"
Should read:
"through"

Column 7, Line 27 reads:
"though"
Should read:
"through"

Signed and Sealed this
Fourth Day of July, 2017

Joseph Matal
*Performing the Functions and Duties of the*
*Under Secretary of Commerce for Intellectual Property and*
*Director of the United States Patent and Trademark Office*